US012804924B2

(12) United States Patent
Amara et al.

(10) Patent No.: US 12,804,924 B2
(45) Date of Patent: Nov. 17, 2026

(54) MANUFACTURING PROCESS OF A VERTICAL-CHANNEL SEMICONDUCTOR DEVICE AND VERTICAL-CHANNEL SEMICONDUCTOR DEVICE

(71) Applicant: STMICROELECTRONICS S.r.l., Agrate Brianza (IT)

(72) Inventors: Sebastiano Amara, Aci Bonaccorsi (IT); Fernando Giovanni Menta, Catania (IT); Salvatore Pisano, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 781 days.

(21) Appl. No.: 18/191,773

(22) Filed: Mar. 28, 2023

(65) Prior Publication Data

US 2023/0326995 A1 Oct. 12, 2023

(30) Foreign Application Priority Data

Apr. 8, 2022 (IT) ........................ 102022000007052

(51) Int. Cl.
*H10D 12/01* (2025.01)
*H10D 12/00* (2025.01)
(Continued)

(52) U.S. Cl.
CPC ......... *H10D 12/032* (2025.01); *H10D 12/038* (2025.01); *H10D 12/441* (2025.01);
(Continued)

(58) Field of Classification Search
CPC .... H10D 12/032; H10D 12/441; H10D 62/60; H10D 12/481; H10D 12/038;
(Continued)

(56) References Cited

U.S. PATENT DOCUMENTS 8,859,392 B1 * 10/2014 Chang .................. H10D 12/038 438/455
9,438,227 B2 * 9/2016 Sin ....................... H10D 12/481
(Continued)

FOREIGN PATENT DOCUMENTS

CN 102693912 B 11/2014
CN 107004578 A 8/2017
(Continued)

OTHER PUBLICATIONS

Gao et al. CN 102693912 B, Machine Translation. (Year: 2014).*

*Primary Examiner* — Andres Munoz
(74) *Attorney, Agent, or Firm* — Seed Intellectual Property Law Group LLP

(57) ABSTRACT

The present disclosure is directed to a vertical-channel semiconductor device. For manufacturing the vertical-channel semiconductor device, starting from a work wafer having a first side and a second side opposite to the first side along a direction, a first doped region is formed in the work wafer, from the second side of the work wafer. The work wafer has a first conductivity type and a first doping level, the first doped region has the first conductivity type and a second doping level higher than the first doping level. A device active region having a channel region extending in the direction is formed in the work wafer, on the first side of the work wafer. The first doped region and the device active region delimit, in the work wafer, a drift region. The first doped region is formed before the device active region.

19 Claims, 12 Drawing Sheets

(51) Int. Cl.

| | |
|---|---|
| ***H10D 62/60*** | (2025.01) |
| ***H10P 30/20*** | (2026.01) |
| ***H10P 30/28*** | (2026.01) |
| ***H10P 32/10*** | (2026.01) |
| ***H10P 32/12*** | (2026.01) |
| ***H10P 72/70*** | (2026.01) |

(52) U.S. Cl.

CPC ........... *H10D 62/60* (2025.01); *H10P 30/212* (2026.01); *H10P 30/28* (2026.01); *H10P 32/12* (2026.01); *H10P 32/171* (2026.01); *H10P 72/74* (2026.01)

(58) Field of Classification Search

CPC .. H10D 64/513; H10D 62/142; H10D 62/213; H10P 32/12; H10P 32/171; H10P 72/7416; H10P 72/7426; H10P 30/204; H10P 72/74; H10P 30/212

See application file for complete search history.

(56) References Cited

U.S. PATENT DOCUMENTS

| | | | | |
|---|---|---|---|---|
| 2007/0096172 | A1* | 5/2007 | Tihanyi ................ | H10D 30/665 257/E21.384 |
| 2013/0026536 | A1* | 1/2013 | Corona ................ | H10D 12/481 257/E29.198 |
| 2014/0167151 | A1* | 6/2014 | Yen ...................... | H10D 30/635 438/270 |
| 2015/0380292 | A1 | 12/2015 | Tachioka et al. | |
| 2018/0151367 | A1* | 5/2018 | Janisch ................... | H10P 32/14 |

FOREIGN PATENT DOCUMENTS

| | | | |
|---|---|---|---|
| CN | 104425258 | B | 10/2017 |
| CN | 220121778 | U | 12/2023 |
| JP | H0758322 | A | 3/1995 |
| JP | H11274484 | A | 10/1999 |
| WO | WO 2016041852 | A1 | 3/2016 |

* cited by examiner

MANUFACTURING PROCESS OF A VERTICAL-CHANNEL SEMICONDUCTOR DEVICE AND VERTICAL-CHANNEL SEMICONDUCTOR DEVICE

BACKGROUND

Technical Field

The present disclosure relates to a manufacturing process of a vertical-channel semiconductor device and a vertical-channel semiconductor device, in particular for power applications.

Description of the Related Art

As is known, nowadays power transistors are available, for example, power MOS transistors and insulated-gate bipolar transistors (IGBTs).

With reference to IGBT transistors, they have an emitter terminal and a collector terminal and are formed in a semiconductor body in which, in use, it is possible to form a vertical-conduction channel that enables a current flow through the semiconductor body between the emitter terminal and the collector terminal.

Known IGBT devices comprise, on the back side of the semiconductor body, a so-called field-stop region, configured to control, in use, the voltage drop on the back side of the IGBT device.

However, the present Applicant has found that the field-stop region of known IGBT devices bestows a low reliability of use on the IGBT devices, which are thus subject to malfunctioning and failure, in particular in power applications.

In power applications, in fact, IGBT devices are subject to high emitter-collector voltages, for example, even higher than 600 V, and high temperatures, for example, even up to 175° C.

In the presence of such operating conditions, the field-stop region of known IGBT devices is unable to guarantee a sufficiently high reliability of the IGBT devices themselves, in specific applications.

BRIEF SUMMARY

Various embodiments of the present disclosure overcome the disadvantages of the prior art.

According to the present disclosure, a manufacturing process of a vertical-channel semiconductor device and a vertical-channel semiconductor device are provided.

A manufacturing process of a vertical-channel semiconductor device starts from a work wafer of semiconductor material having a first side and a second side opposite to the first side along a direction, the work wafer having a first conductivity type and a first doping level. The manufacturing process includes forming, in the work wafer, from the second side of the work wafer, a first doped region having the first conductivity type and a second doping level higher than the first doping level; and forming, in the work wafer, from the first side of the work wafer, a device active region including a channel region extending along the direction. The first doped region and the device active region delimit, in the work wafer, a drift region. Forming the first doped region is performed before forming the device active region.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

Figure 1:
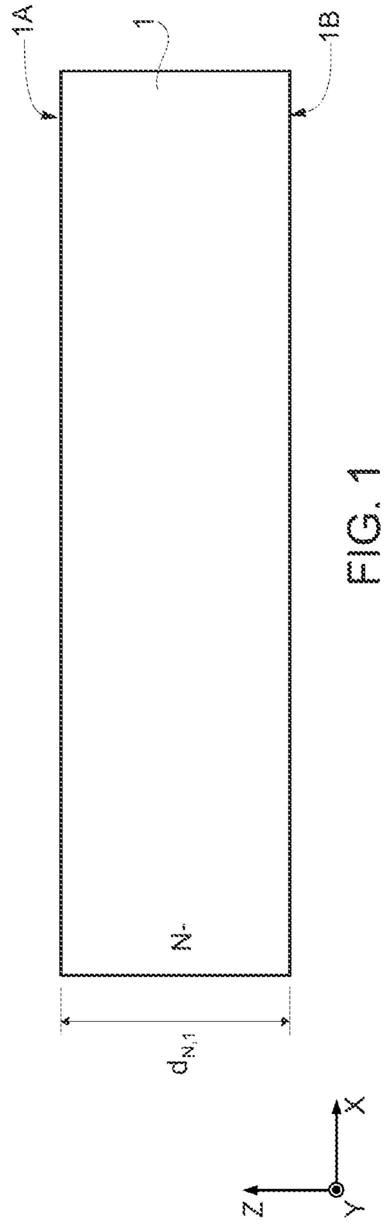
FIGS. 1-4 shows cross-sections of a wafer of semiconductor material in successive manufacturing steps, according to an embodiment of the present manufacturing process.

FIG. 1 shows a wafer 1 in a cartesian reference system XYZ comprising a first axis X, a second axis Y, and a third axis Z.

The wafer 1 is of semiconductor material, in particular here silicon, and has a front surface 1A and a back surface 1B opposite to the front surface 1A along the third axis Z.

The wafer 1 has a thickness $d_{N,1}$, along the third axis Z. For instance, the thickness $d_{N,1}$ may be approximately 725 μm with a tolerance of 10%. However, the wafer 1 may have a different thickness $d_{N,1}$, which may be chosen as a function of the machinery used for processing of the wafer 1.

In this embodiment, the wafer 1 is of an N− type and has a resistivity comprised, for example, between 10 Ω·cm and 1000 Ω·cm.

The wafer 1 may have a constant or not constant doping level along the respective thickness $d_{N,1}$, according to the specific application.

Figure 2:
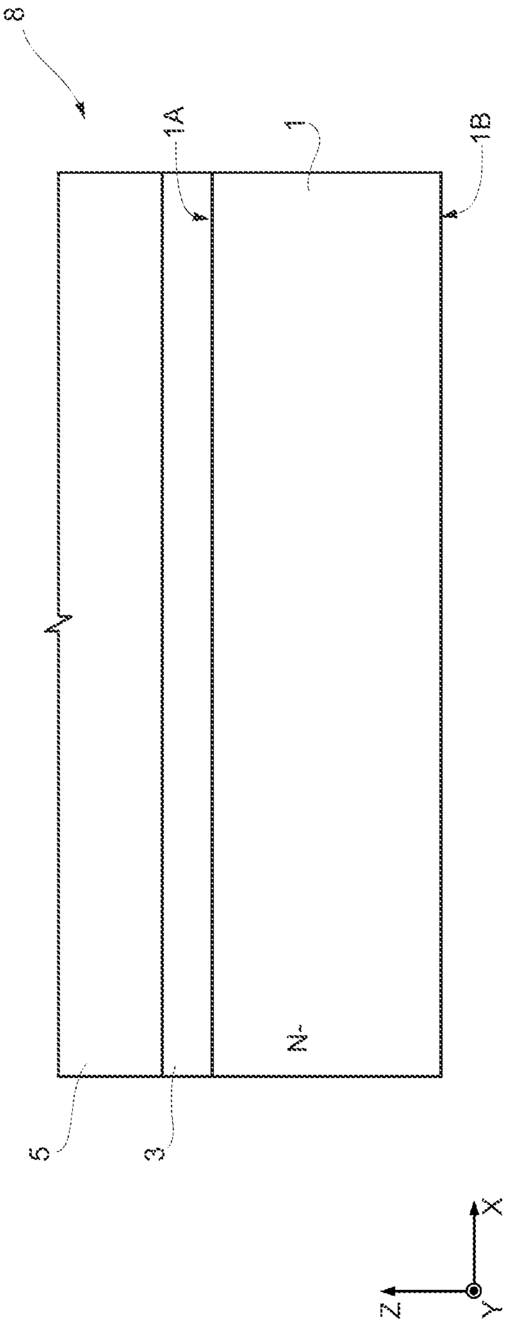

Next, FIG. 2, a first support body 5 is fixed to the front surface 1A of the wafer 1 by an adhesive layer 3, thereby forming a composite body 8.

The first support body 5, for example of quartz or silicon, has a thickness along the third axis Z, for example of a few hundreds of micrometers, which may be chosen at the design stage so as to facilitate the subsequent manufacturing steps, according to the specific machinery used.

The adhesive layer 3 may be of a glue suitable for wafer bonding and debonding, for example usable at a temperature of about 280° C., or may be an oxide layer or a stack of layers including an oxide and a nitride, according to the specific process of bonding the supporting body 5 onto the wafer 1.

Figure 3:
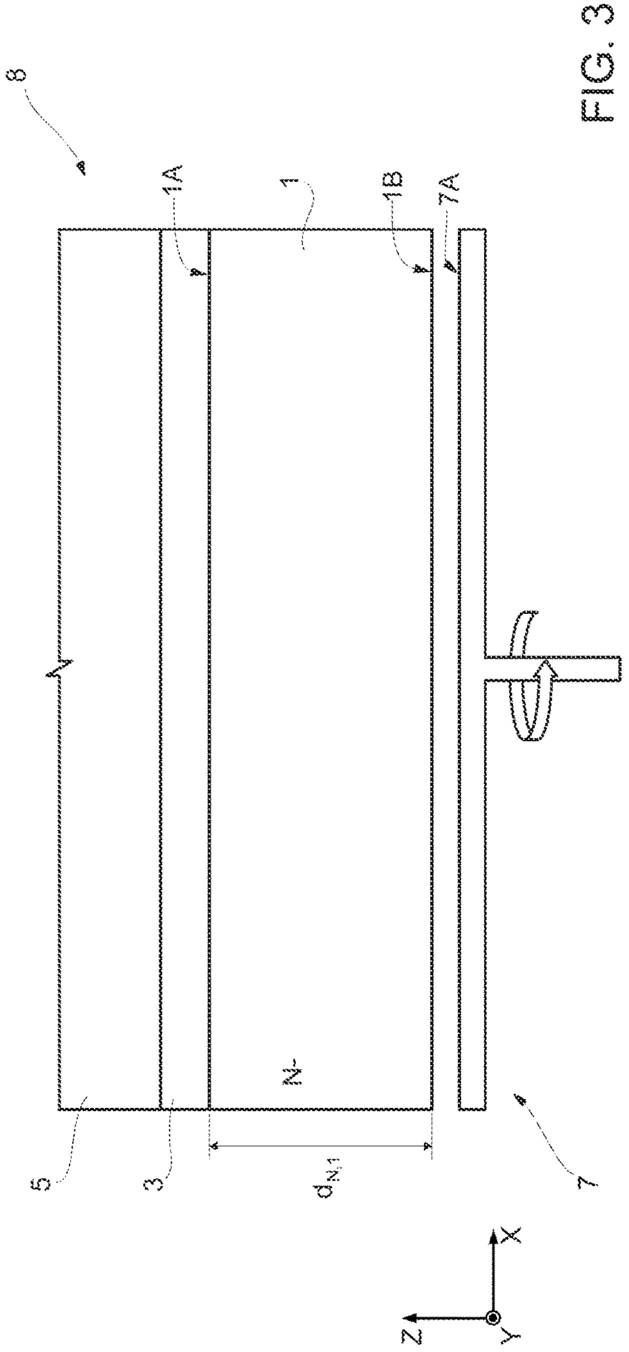
Figure 4:
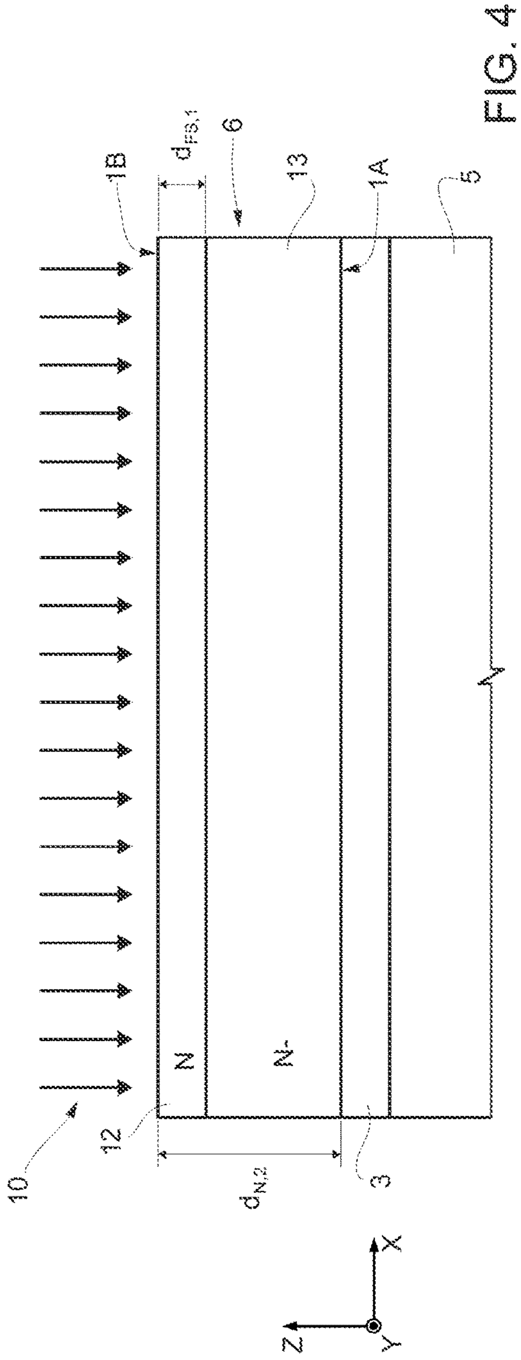

The wafer 1 is then subjected, FIG. 3, to a thinning step, from the respective back surface 1B, thereby forming a thinned wafer 6 (FIG. 4).

Once again with reference to FIG. 3, the composite body 8 may be turned upside down or not, according to the specific machinery used for the thinning.

In this embodiment, the wafer 1 is thinned by a lapping process of a mechanical/chemical type.

In detail, the back surface 1B of the wafer 1 is subjected to mechanical grinding, using a grinding wheel 7 having an abrasive surface 7A, and subsequent chemical finishing.

For instance, chemical finishing may be used for removing a thickness of the wafer 1 comprised between 5 μm and 20 μm.

The thinned wafer 6 (FIG. 4) has a front surface, still designated by 1A, and a back surface, corresponding to the back surface 1B of the wafer 1 and thus still designated by 1B.

The thinned wafer 6 has a thickness $d_{N,2}$, along the third axis Z, comprised for example between 40 μm and 200 μm, in particular comprised between 40 μm and 60 μm.

Next, FIG. 4, dopant ions of an N type, indicated by arrows 10, for example atoms of phosphorus, arsenic or antimony, in particular here phosphorus atoms, are implanted on the back surface 1B of the thinned wafer 6.

The dopant ions 10 may be implanted with an implantation energy comprised, for example, between 100 keV and 1500 keV.

The dopant ions 10 may be implanted with a dose comprised, for example, between $1 \cdot 10^{12}$ and $1 \cdot 10^{15}$ atoms/$cm^2$.

The dopant ions 10 form a heavily doped layer 12 extending in the thinned wafer 6 from the back surface 1B and having a thickness $d_{FS,1}$ along the third axis Z, for example up to about 4 μm.

After the implantation of the dopant ions 10, the thinned wafer 6 is thus formed by the heavily doped layer 12 and by a work drift layer 13 having the same doping level as the thinned wafer 6.

The heavily doped layer 12 has a doping level higher than the doping level of the work drift layer 13, and thus a resistivity lower than that of the work drift layer 13.

Figure 5:
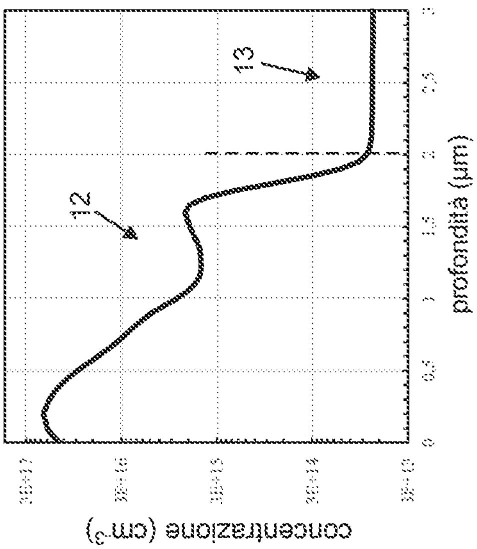
FIG. 5 shows a doping profile of a portion of the wafer of FIG. 4.

FIG. 5 shows an example of a doping profile of a portion of the thinned wafer 6, in a direction parallel to the third axis Z, from the back surface 1B of the thinned wafer 6.

The heavily doped layer 12 has a maximum concentration of dopant atoms in the proximity of the back surface 1B of the thinned wafer, for example comprised between $1 \cdot 10^{15}$ atoms/$cm^3$ and $1 \cdot 10^{18}$ atoms/$cm^3$, in particular here of about $3 \cdot 10^{17}$ atoms/$cm^3$.

The concentration of dopant atoms of the heavily doped layer 12 decreases with depth in the thinned wafer 6, along the third axis Z, up to an interface, arranged at about 2 μm from the back surface 1B in the example illustrated, with the work drift layer 13. The interface between the heavily doped layer 12 and the work drift layer 13 is represented, for clarity, by a dashed line in FIG. 5.

According to a different embodiment, not illustrated herein, the dopant ions 10 may be implanted in the back surface 1B using a specific mask so as to form a doping pattern on the back surface 1B, according to the specific application.

Figure 6:
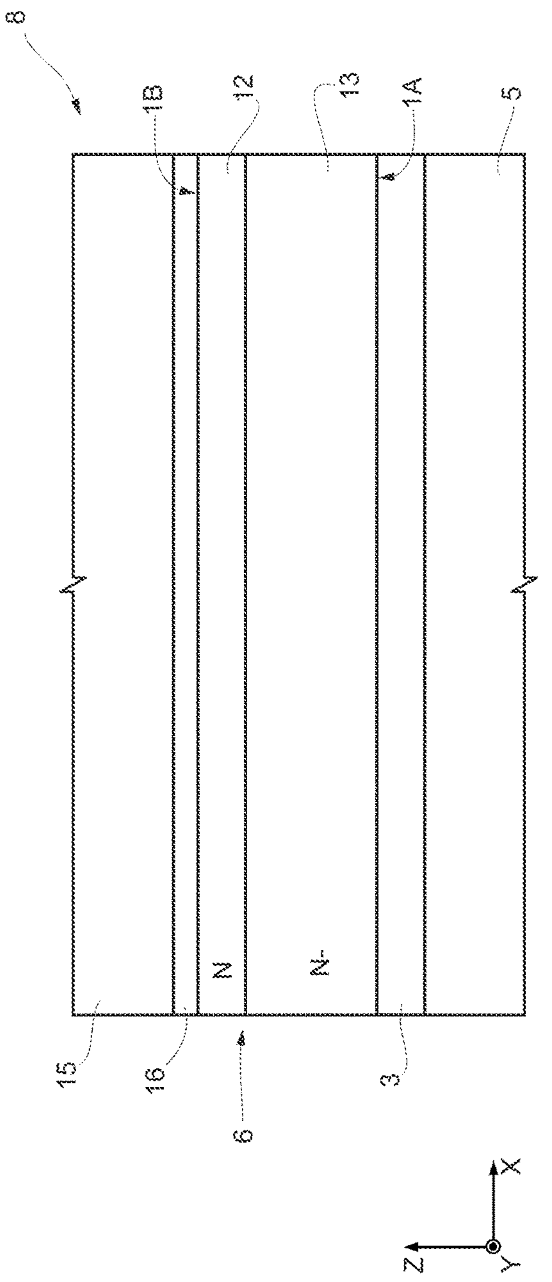
FIGS. 6 and 7 show cross-sections of the wafer of FIG. 4, in subsequent manufacturing steps.

Then, FIG. 6, a second support body 15 is fixed to the back surface 1B of the thinned wafer 6 by a bonding layer 16.

The second support body 15 may be a wafer of silicon or other material, suitable for high-temperature processing, for example at a temperature higher than 400° C., in particular up to approximately 1300° C.

The bonding layer 16 is an oxide layer, for example a silicon-oxide layer grown thermally on the back surface 1B of the thinned wafer 6, and has a thickness along the third axis Z for example less than 1 μm.

In practice, also the second bonding layer 16 is suitable for high-temperature processing, for example at a temperature higher than 400° C., in particular up to approximately 1300° C.

The first support body 5 and the adhesive layer 3 are removed.

In practice, after the processing step of FIG. 6, the composite body 8 comprises (FIG. 7) the thinned wafer 6, the second support body 15 and the bonding layer 16.

Figure 7:
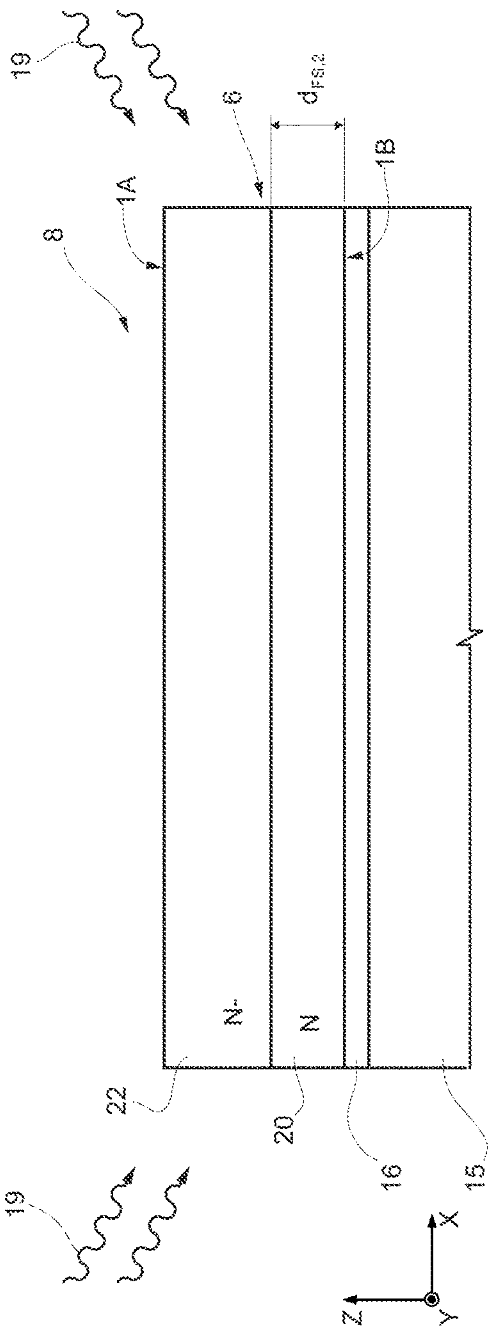

Still with reference to FIG. 7, the composite body 8 is subjected to annealing, schematically represented by arrows 19, at a temperature that allows the diffusion of the dopant ions 10 of the heavily doped layer 12 in the thinned wafer 6.

Furthermore, in this embodiment, the annealing of FIG. 7 is configured also for activating the dopant ions 10.

In detail, the thermal annealing may be carried out in a reactor, for example a furnace, or may be of a different type, for example a laser annealing or of a different type.

In this embodiment, where the dopant ions 10 are phosphorus atoms, the annealing is carried out at a temperature higher than 400° C., for example up to 1300° C., in particular at a temperature of approximately 1000° C.-1250° C., even more in particular at a temperature comprised between 1150° C. and 1250° C.

The annealing causes the dopant ions 10 to diffuse in the thinned wafer 6; the heavily doped layer 12 thus forms a diffused layer 20 having a thickness $d_{FS,2}$ greater than the thickness $d_{FS,1}$ of the heavily doped layer 12.

For instance, in the case where the dopant ions 10 are phosphorus ions, by annealing the composite body 8 at a temperature of about 1200° C. for approximately 24 hours, it is possible to obtain an increase of the thickness $d_{FS,1}$ of about 5-6 μm. Using a higher temperature, for example of about 1260° C.-1280° C., it is possible to obtain an increase in the thickness $d_{FS,1}$ of even up to about a hundred micrometers.

The thickness $d_{FS,2}$ of the diffused layer 20 is comprised, for example, between 2 μm and 40 μm.

Consequently, the work drift layer, now designated by 22, has a thickness smaller than the thickness prior to annealing.

Figure 8:
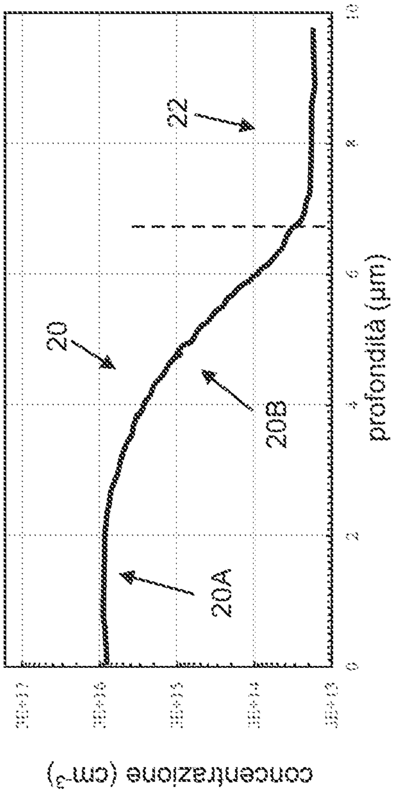
FIG. 8 shows a doping profile of a portion of the wafer of FIG. 7.

FIG. 8 shows an example of a doping profile of a portion of the thinned wafer 6, in a direction parallel to the third axis Z, from the back surface 1B of the thinned wafer 6, after the annealing of FIG. 7.

In this embodiment, the diffused layer 20 has a surface portion 20A and a deep portion 20B.

The surface portion 20A extends in the thinned wafer 6 from the back surface 1B up to a depth, for example of about 2 μm along the third axis Z, and has a concentration of dopant atoms that is approximately constant, for example comprised between $1 \cdot 10^{15}$ atoms/$cm^3$ and $1 \cdot 10^{18}$ atoms/$cm^3$, here of about $3 \cdot 10^{16}$ atoms/$cm^3$.

The deep portion 20B extends contiguous to the surface portion 20A, deep in the thinned wafer 6, up to the interface with the work drift layer 22. The interface between the work drift layer 22 and the diffused layer 20 is represented in FIG. 8, for clarity, by a dashed line.

The concentration of dopant atoms of the deep portion 20B has a decreasing profile, from the maximum concentration of the surface portion 20A, to the concentration of dopant atoms of the work drift layer 22.

In practice, the diffused layer 20 has a doping profile that is substantially monotonic along the third axis Z.

The doping profile, along the third axis Z, of the diffused layer 20, i.e., the maximum concentration value of the surface portion 20A, the thickness of the surface portion 20A and the thickness of the deep portion 20B, may be modified by changing temperature and duration of the annealing of FIG. 7, according to the specific application.

Figure 9:
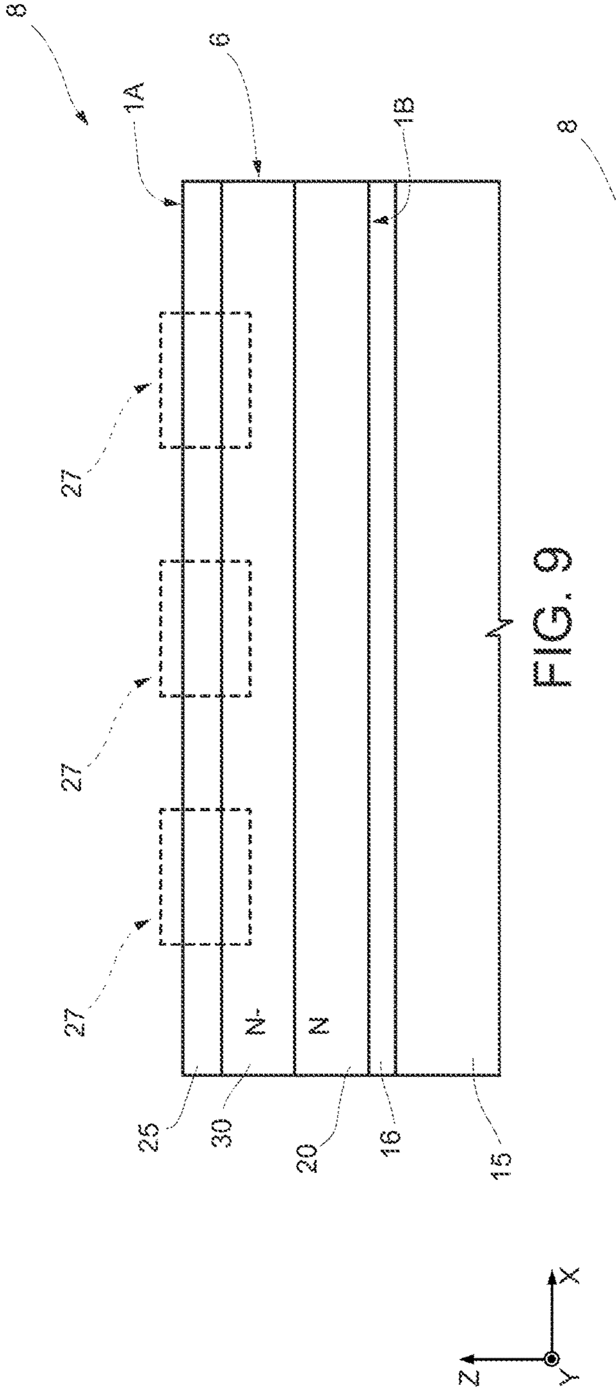
FIGS. 9-12 show cross-sections of the wafer of FIG. 7, in subsequent manufacturing steps.

Next, FIG. 9, the thinned wafer 6 is processed on the front side, i.e., on the front surface 1A, so as to form a device functional layer (or region) 25.

The device functional layer 25 may be formed in the work drift layer 22 or may be an epitaxial layer grown on the work drift layer 22.

The device functional layer 25 comprises current-conduction regions, whose number, structure and configuration depend upon the specific application.

For instance, the device functional layer 25 may comprise one or more implanted regions that may form, for example, source or emitter regions and body regions.

The device functional layer 25 may also comprise gate regions, for example of the trench type or of a different type.

Figure 13:
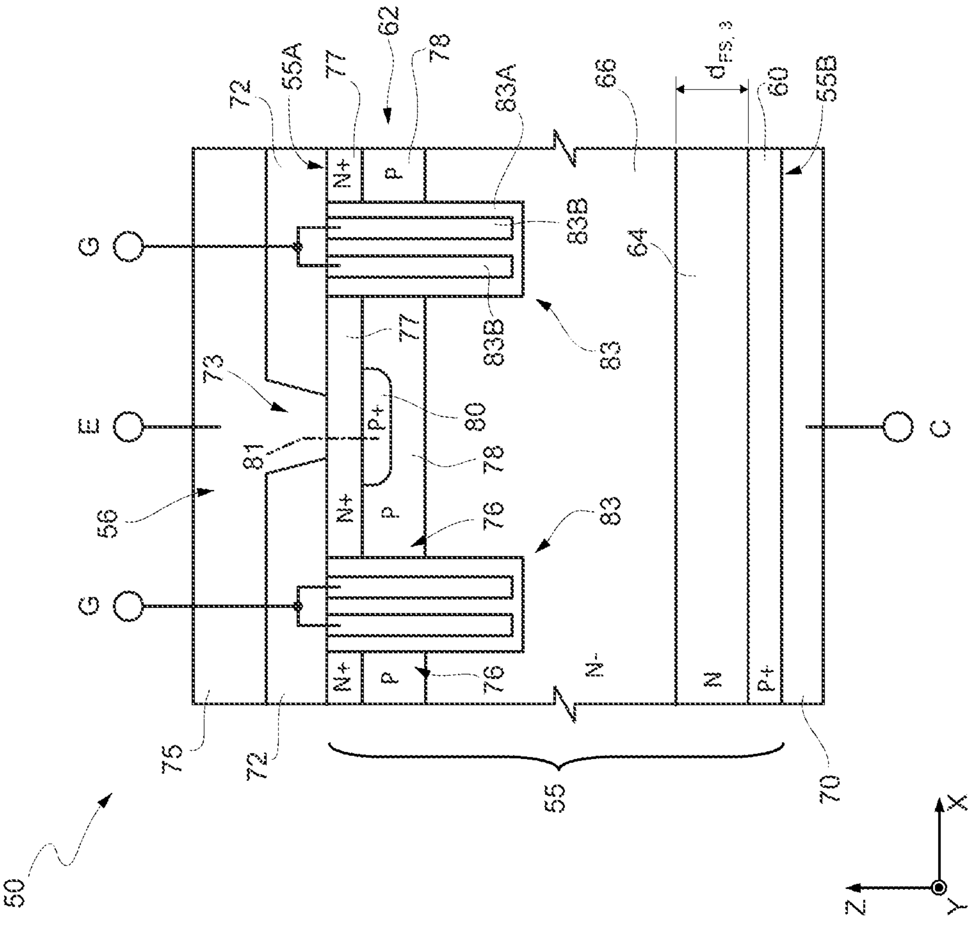
FIG. 13 shows a cross-section of the present vertical-channel semiconductor device.

An example of device functional layer 25 is illustrated in FIG. 13 and designated by the reference number 62.

According to further embodiments, the device functional layer 25 may be a multilayer having different device structures integrated therein.

The device functional layer 25 is patterned along the first axis X and along the second axis Y, in a way not illustrated here, so as to form a plurality of die portions 27, schematically represented by a dashed line in FIG. 9.

The die portions 27 each identify a respective portion of the device functional layer 25 associated, at the end of the manufacturing process, to a respective semiconductor device.

The device functional layer 25 is intended to form, for each die portion 27, at least one vertical-channel region of the present semiconductor device, as discussed with reference to FIG. 13.

In practice, the thinned wafer 6 is now formed by the diffused layer 20, forming the back surface 1B, by the device functional layer 25, forming the front surface 1A, and by a drift layer, here designated by 30, extending between the diffused layer 20 and the device functional layer 25.

Figure 10:
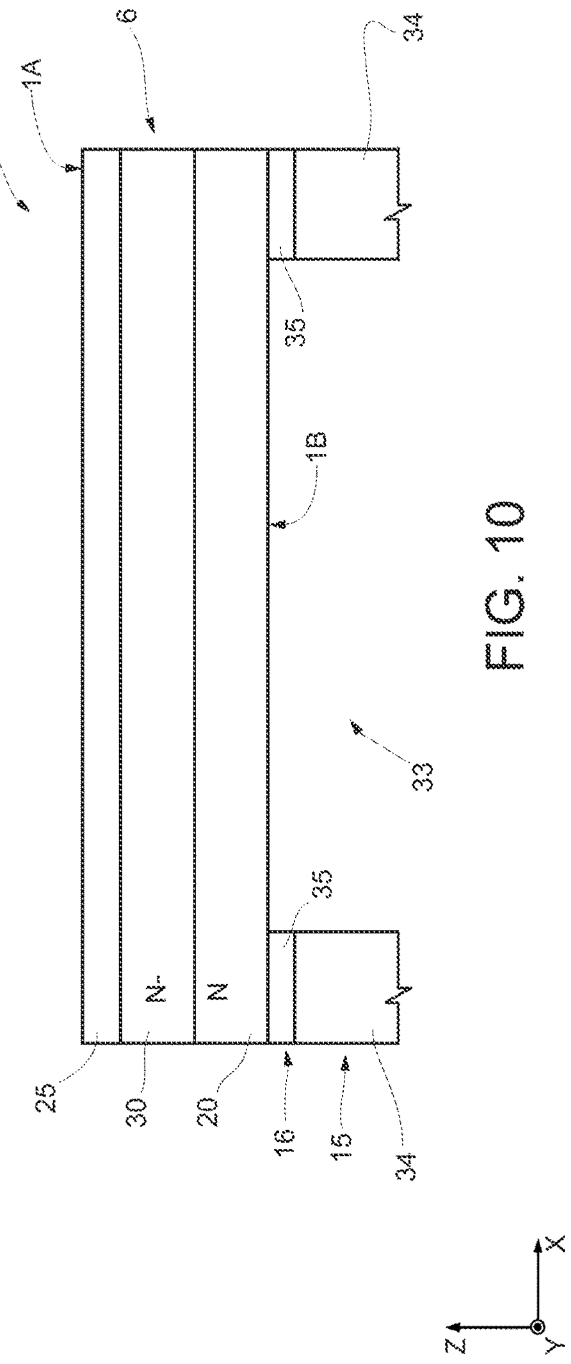

Then, FIG. 10, a window 33 is formed through the second support body 15 and the bonding layer 16 so as to expose a central portion of the back surface 1B of the thinned wafer 6.

In practice, of the second support body 15 and of the bonding layer 16 residual lateral portions 34, 35 remain, which are useful for handling the composite body 8 in the subsequent processing steps.

Figure 11:
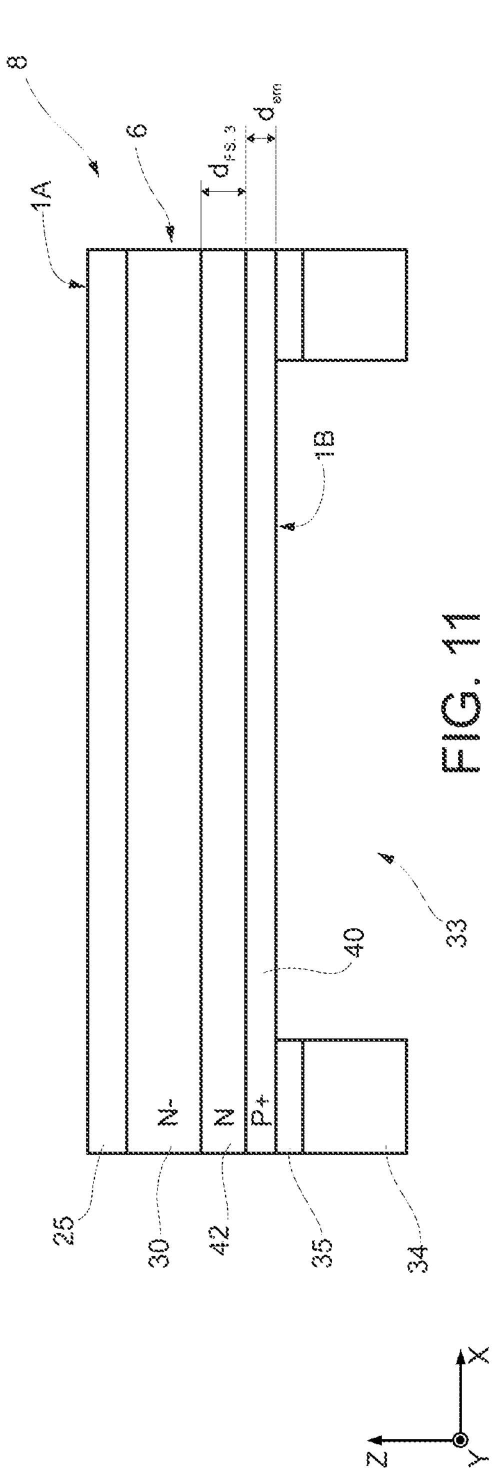

In this embodiment, FIG. 11, a back conductive layer 40, of a P+ type, is formed in the thinned wafer 6, through the window 33.

The back conductive layer 40 may be formed via implantation of dopant atoms of a P type, for example atoms of boron or aluminum, here boron atoms, on the portion of the back surface 1B exposed by the window 33.

The back conductive layer 40 has a doping level comprised, for example, between $1\cdot10^{16}$ atoms/cm$^3$ and $1\cdot10^{20}$ atoms/cm$^3$.

The composite body 8 may be subjected to a step of annealing configured to activate the dopant atoms of the back conductive layer 40.

The back conductive layer 40 has a thickness $d_{em}$, along the third axis Z, comprised, for example, between 0.3 μm and 5 μm.

In practice, after the formation of the back conductive layer 40, the diffused layer, now designated by 42, has a thickness $d_{FS,3}$ along the third axis Z, given by the difference between the thickness $d_{FS,2}$ and the thickness $d_{em}$, and extends between the drift layer 30 and the back conductive layer 40.

For instance, the thickness $d_{FS,3}$ of the diffused layer 42 may be comprised between 2 μm and 40 μm, in particular between 5 μm and 10 μm.

Figure 12:
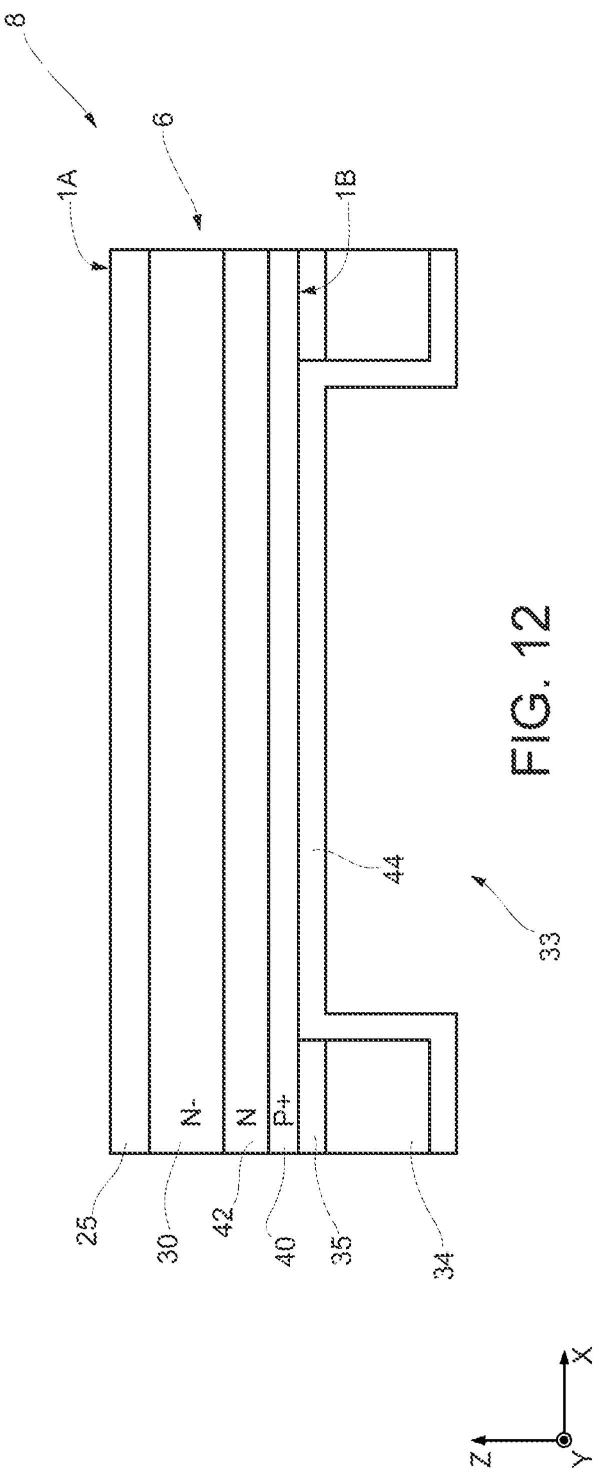

Then, FIG. 12, a back metallization layer 44 is formed on the back side of the composite body 8, in such a way that the back metallization layer 44 extends in the window 33, on the exposed portion of the back surface 1B of the thinned wafer 6.

The back metallization layer 44 may be formed by one metal layer or by more metal layers stacked on top of one another, for example formed by one or more from among aluminum, titanium, nickel and silver, according to the specific application.

The composite body 8 is then subjected to known processing steps, such as removal of the residual portions 34, 35 of the second support body 15 and of the bonding layer 16, dicing of the thinned wafer 6, and electrical connection, which lead to formation of a plurality of vertical-channel semiconductor devices, of which an example designated by the reference number 50 is illustrated in FIG. 13, each associated to a respective die portion 27.

In the manufacturing process described with reference to FIGS. 1-12, the fact that the diffused layer 20 is formed before the processing on the front side of the thinned wafer 6, i.e., before formation of the device functional layer 25, allows a high thermal budget to be used in the annealing step of FIG. 7.

The present manufacturing process thus allows a high flexibility in the choice of the parameters of the diffused layer 20, i.e., such as thickness, doping level and concentration profile of the dopant atoms.

Furthermore, the fact that the step of thinning the wafer 1 is performed during initial steps of the present manufacturing process, using the first support body 5, enables simplification of the thinning step.

In detail, this entails that the thinned wafer 6 may be thin; for example, the thickness $d_{N,2}$ may be comprised between 40 μm and 200 μm, in particular between 40 μm and 60 μm.

Furthermore, this allows, during manufacturing, to obtain a high level of control of the thickness of the thinned wafer 6.

With reference to FIG. 13, the vertical-channel semiconductor device 50, referred to hereinafter simply as electronic device 50, is formed in a die or body 55 of semiconductor material, here silicon, having a front surface 55A and a back surface 55B.

The die 55, corresponding to the thinned wafer 6, has a thickness along the third axis Z comprised, for example, between 40 μm and 200 μm, in particular between 40 μm and 60 μm.

In detail, FIG. 13 shows a cell 56 of the electronic device 50; however, the electronic device 50 may be formed by a plurality of cells connected together in parallel, equal to or different from one another, according to the specific application of the electronic device 50.

In this embodiment, the electronic device 50 is an insulated-gate bipolar transistor (IGBT).

The electronic device 50 comprises a back conduction region 60, of a P+ type, forming the back surface 55B of the die 55 and corresponding to the back conduction layer 40; and a device surface region 62, forming the front surface 55A of the die 55 and corresponding to the device functional layer 25.

The electronic device 50 comprises a thermally diffused conduction region 64, of an N type, corresponding to the diffused layer 42 and extending over the back conduction region 60; and a drift region 66, of an N− type, corresponding to the drift layer 30 and extending between the thermally diffused conduction region 64 and the device surface region 62.

The thermally diffused conduction region 64 has the thickness $d_{FS,3}$ along the third axis Z, comprised, for example, between 2 μm and 40 μm, in particular between 5 μm and 10 μm.

Furthermore, as described with reference to FIG. 8, the thermally diffused conduction region 64 has a doping profile that is substantially monotonic along the third axis Z.

The electronic device 50 comprises a back metallization region 70, corresponding to the metallization layer 44 and extending on the back surface 55B of the die 55. The back metallization region 70 forms a collector terminal C of the electronic device 50.

The electronic device 50 further comprises a passivation region 72, of dielectric material, for example silicon oxide, nitrides or polyimides of various types, extending on the front surface 55A of the die 55, which forms a via 73 facing an exposed part of the front surface 55A.

The electronic device 50 further comprises a front metallization region 75 extending on the passivation region 72 and within the via 73, in direct contact with the exposed part of the front surface 55A.

The front metallization region 75 forms an emitter terminal E of the electronic device 50.

The device surface region 62 forms an active region of the electronic device 50 and defines a vertical-channel region 76 of the electronic device 50 that enables, in use, to control a current flow between the collector terminal C and the emitter terminal E.

As discussed with reference to FIG. 9 for the device functional layer 25, the device surface region 62 accommodates functional regions of different types and dimensions, according to the specific type of the electronic device 50 and the specific application thereof.

In this embodiment, the device surface region 62 comprises an emitter or source region 77, of an N+ type, extending in the die 55 from the front surface 55A, and a body region 78, of a P type, extending in the die 55 from the emitter region 77, at a distance from the front surface 55A.

The source region 77 has a doping level comprised, for example, between $1\cdot10^{19}$ atoms/cm$^3$ and $1\cdot10^{20}$ atoms/cm$^3$.

The body region 78 has a doping level comprised, for example, between $1\cdot10^{15}$ atoms/cm$^3$ and $1\cdot10^{18}$ atoms/cm$^3$.

The device surface region 62 further comprises a body-contact region 80, of a P+ type, extending in the body region 78 and electrically connected to the front metallization region 75, for example through dedicated conductive regions, here represented schematically by a dashed and dotted line 81.

The device surface region 62 further comprises gate regions 83 forming a gate terminal G of the electronic device 50.

In this embodiment, the gate regions 83 are of the trench type and extend in the die 55 from the front surface 55A to a depth, along the third axis Z, greater than the depth of the body region 78. In practice, the gate regions 83 extend partially also in the drift region 66.

In detail, the gate regions 83 are formed by an insulating portion 83A made, for example, of oxide, and a conductive portion 83B made, for example, of heavily doped polysilicon, accommodated in the insulating portion 83A. In practice, the insulating portion 83A electrically insulates the respective conductive portion 83B from the die 55.

The vertical-channel region 76 extends in the body region 78, along the third axis Z, between the source region 77 and the drift region 66.

In use, a voltage may be applied to the gate terminal G. It is possible to control a conductivity level of the vertical-channel region 76, as a function of the voltage applied to the gate terminal G, so as to control a current flow between the emitter terminal E and the collector terminal C.

For instance, it is possible to switch the electronic device 50 between an OFF state and an ON state, as a function of the voltage applied to the gate terminal G.

In use, the thermally diffused conduction region 64 works as a field-stop region; i.e., it is configured to control the voltage drop on the back side of the die 55.

In detail, the presence of the thermally diffused conduction region 64 allows the electronic device 50 to have a high reliability, in use.

In fact, as described above with reference to the manufacturing process of FIGS. 1-12, the fact that the thermally diffused conduction region 64 is formed via diffusion of dopants, allows a high design versatility of the thermally diffused conduction region 64, thereby optimizing the characteristics thereof according to the specific application.

In detail, the fact that the thermally diffused conduction region 64 is formed via diffusion of dopants allows to obtain a large thickness of the thermally diffused conduction region 64, as discussed above, even if the die 55 is thin, for example having a thickness comprised between 40 μm and 200 μm.

The large thickness of the thermally diffused conduction region 64 enables the electronic device 50 to have a high electrical robustness, in use, even in the presence of high emitter-collector voltages and in high-temperature operating conditions.

In fact, the thermally diffused conduction region 64 enables to reduce the probability of the electronic device 50 to be subject to malfunctioning and failure; for example, the probability of the so-called punch-through to occur is reduced, even in the presence of overvoltage peaks when the electronic device 50 is OFF or when the electronic device 50 is in a short-circuit condition.

Furthermore, the possibility to control the doping profile of the thermally diffused conduction region 64 contributes to increasing the electrical robustness of the electronic device 50.

Consequently, the electronic device 50 is particularly suited for being used in power applications, for example to obtain devices such as inverters, motor-control devices, etc., for example in the automotive or industrial sectors.

Described hereinafter with reference to FIGS. 14-21 is a different embodiment of the present manufacturing process, from a composite body, here designated by 108.

Figure 14:
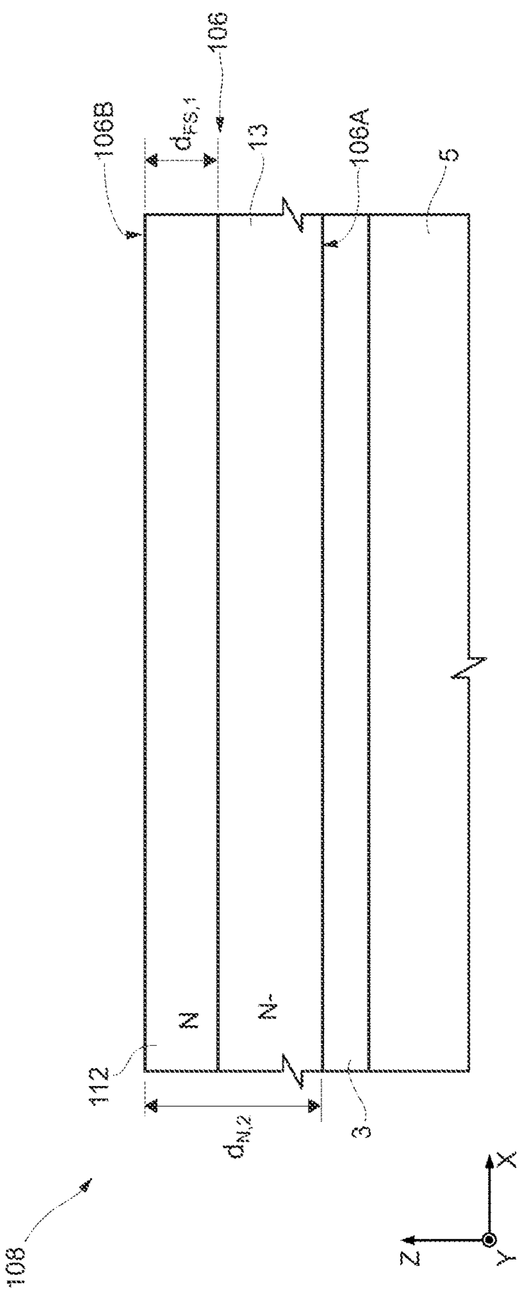
FIGS. 14-16 show cross-sections of a wafer of semiconductor material in subsequent manufacturing steps, according to a different embodiment of the present manufacturing process.

In detail, FIG. 14, the composite body 108 is the same as the composite body 8 of FIG. 4; consequently, elements in common are designated by the same reference numbers and are not described any further.

The composite body 108 comprises a thinned wafer, here designated by 106, of semiconductor material, in particular here of silicon.

The thinned wafer 106 has already undergone thinning, as described with reference to FIG. 3 for the thinned wafer 6.

In detail, the thinned wafer 106 has a front surface, here designated by 106A and corresponding to the front surface 1A of the thinned wafer 6, and a back surface, here designated by 106B and corresponding to the back surface 1B of the thinned wafer 6.

Furthermore, in the thinned wafer 106, a heavily doped layer, here designated by 112, has already been formed similarly to what has been described for the heavily doped layer 12 of FIG. 4.

Figure 15:
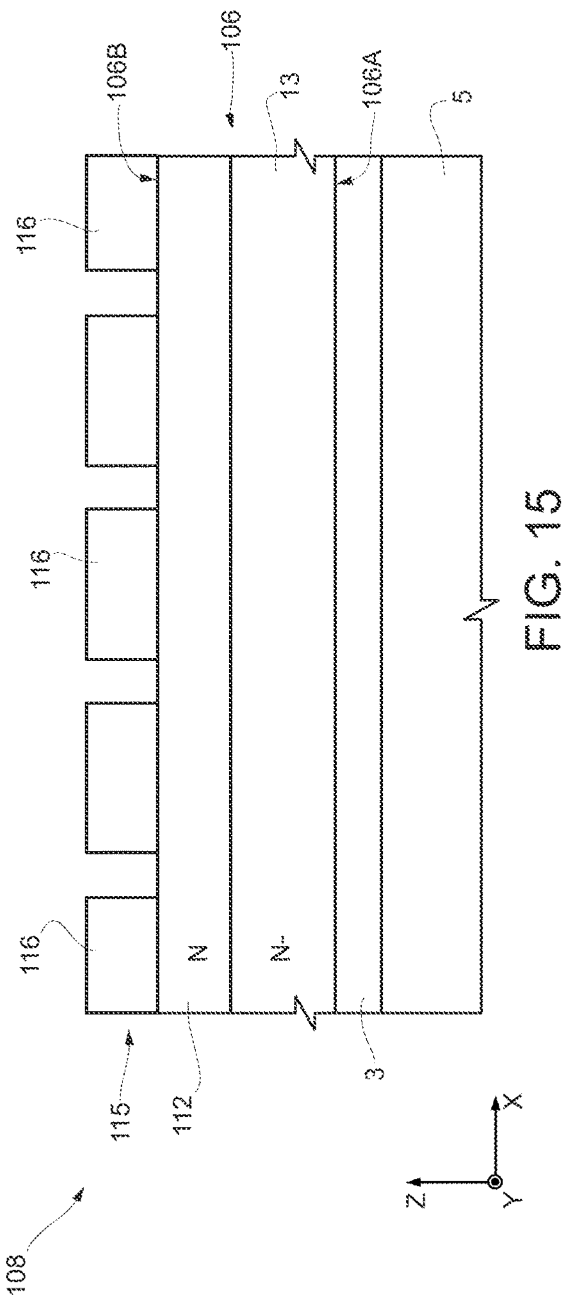

Next, FIG. 15, a mask 115 is formed on the back surface 106B of the thinned wafer 106, for example through lithographic and etching processes. The mask 115 is formed by a plurality of portions 116, separated from one another so as to expose portions of the back surface 106B of the thinned wafer 106.

Figure 16:
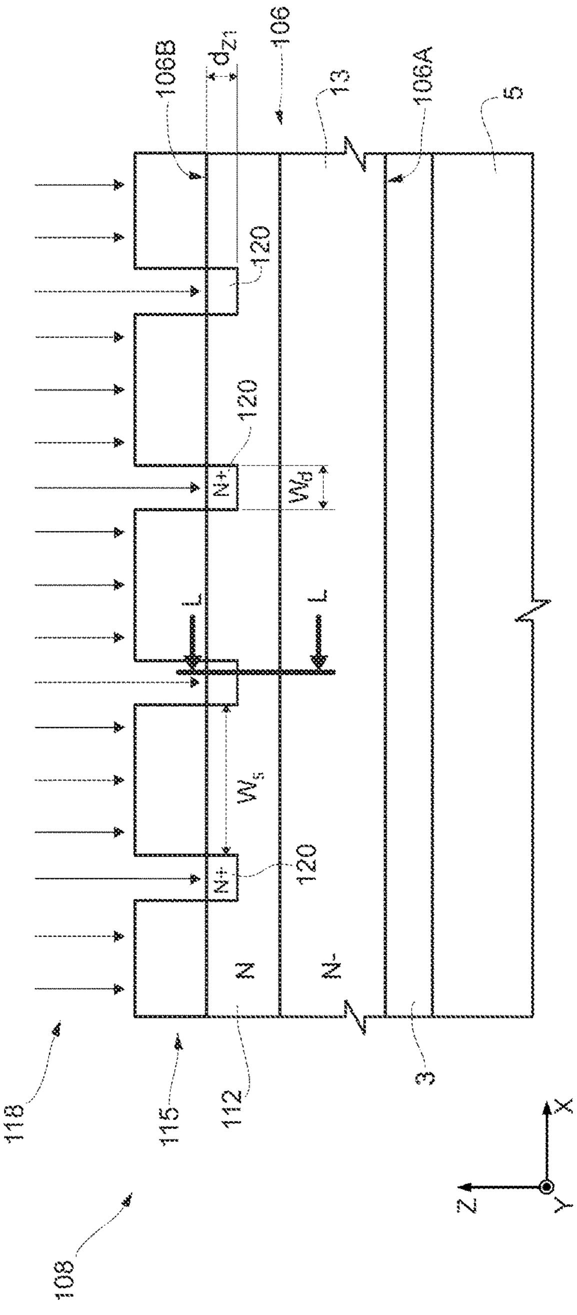

Then, FIG. 16, dopant ions of an N type, indicated by arrows 118, are implanted on the back surface 106B of the thinned wafer 106.

In this embodiment, the dopant ions 118 are of a species different from that of the dopant ions 10 that form the heavily doped layer 112.

For example, the dopant ions 118 may be ions of arsenic or antimony, and the dopant ions 10 of the heavily doped layer 112 may be phosphorus ions.

However, alternatively, the dopant ions 118 may be of the same species as the dopant ions 10 that form the heavily doped layer 112.

The dopant ions 118 form a plurality of surface implanted portions 120 extending in the heavily doped layer 112, at the portions of the back surface 106B exposed by the portions 116 of the mask 115.

In detail, the surface implanted portions 120 have a thickness $d_{Z1}$, along the third axis Z, smaller than the thickness $d_{FS,1}$ of the heavily doped layer 112, for example comprised between 0.3 μm and 5 μm.

The surface implanted portions 120 each have a width $W_d$, along the first axis X, comprised, for example, between tens of micrometers and hundreds of micrometers, in particular between 10 μm and 500 μm, and are separated from one another, along the first axis X, by a width $W_s$ comprised, for example, between tens of micrometers and hundreds of micrometers, in particular between 10 μm and 500 μm.

The surface implanted portions 120 may form in top plan view, here not shown, strips elongated along the second axis Y, cells having a regular or irregular shape, or may have any other shape and configuration, according to the specific application.

For example, the surface implanted portions 120 may each have a width, along the second axis Y, comprised between 10 μm and 500 μm, and be separated from one another by a width comprised between 10 μm and 500 μm.

The surface implanted portions 120 have a higher doping level than the heavily doped layer 112.

Figure 17:
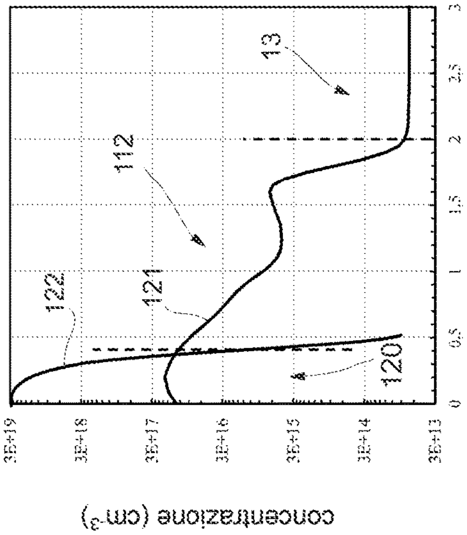
FIG. 17 shows a doping profile of a portion of the wafer of FIG. 16.

In detail, FIG. 17 shows an example of a doping profile of a portion of the thinned wafer 106, along the line L-L of FIG. 16.

In the graph of FIG. 17, the doping profile of the heavily doped layer 112 is indicated by a line 121, and the doping profile of the surface implanted portion 120 is indicated by a line 122.

The doping profile of the heavily doped layer 112 is the same as the profile described with reference to FIG. 5 for the heavily doped layer 12.

The surface implanted portions 120 have a maximum concentration of dopant atoms in the proximity of the back surface 106B, for example comprised between $1 \cdot 10^{18}$ atoms/cm$^3$ and $1 \cdot 10^{20}$ atoms/cm$^3$, in particular here of about $3 \cdot 10^{19}$ atoms/cm$^3$. The concentration of dopant atoms of the surface implanted portions 120 decreases moving from the back surface 106B, up to an interface, here indicated by a dashed line, with the heavily doped layer 112. In the example illustrated, said interface, which corresponds to the thickness $d_{Z1}$ of the surface implanted portions 120, is arranged at about 0.5 μm from the back surface 106B.

Figure 18:
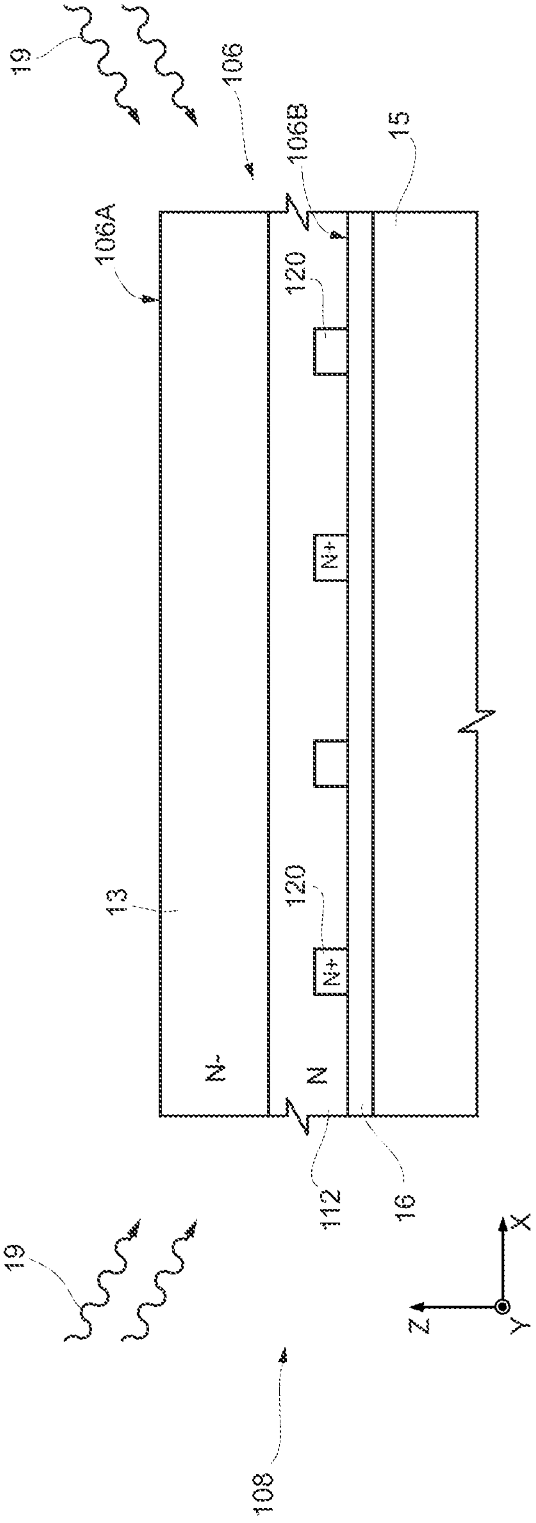
FIGS. 18 and 19 show cross-sections of the wafer of FIG. 16, in subsequent manufacturing steps.

Next, similarly to what has been discussed with reference to FIGS. 6 and 7, and thus not described in any further detail here, the second support body 15 is fixed to the back surface 106B of the wafer 106 via the bonding layer 16, the first support body 5 and the adhesive layer 3 are removed, and the composite body 108 is subjected to annealing (FIG. 18).

Figure 19:
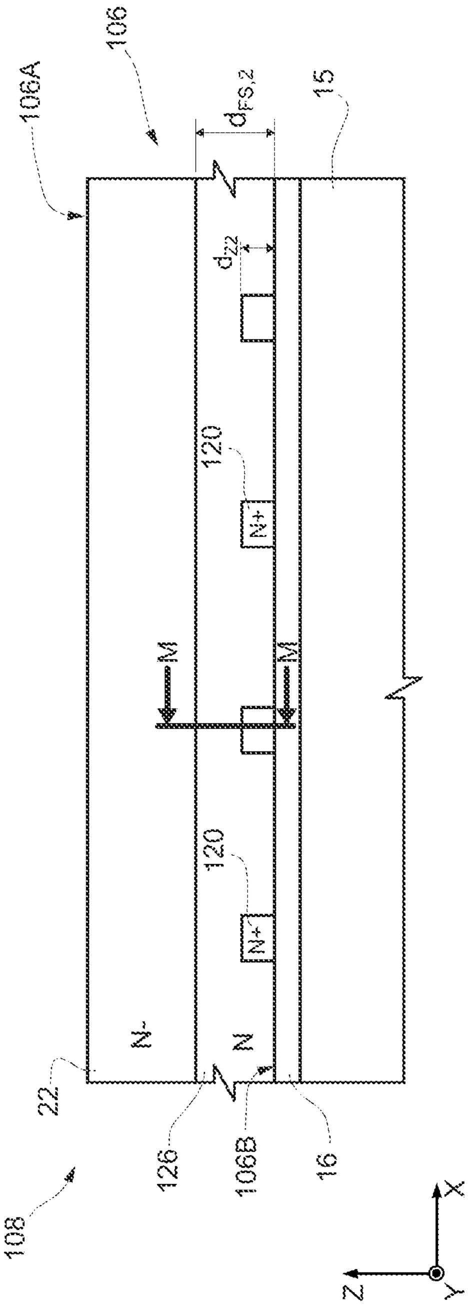
Figure 20:
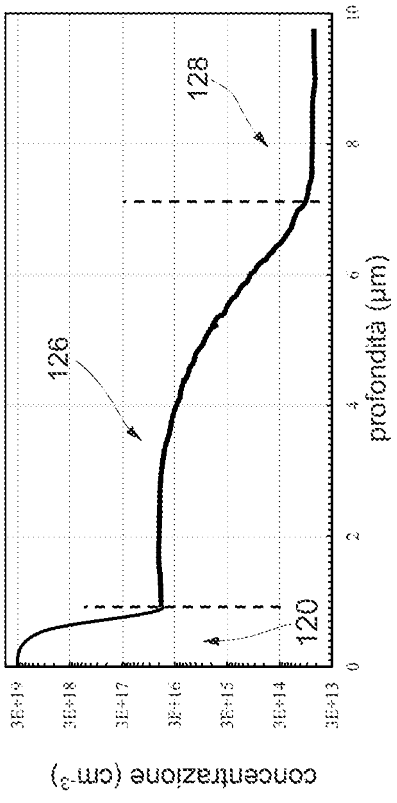
FIG. 20 shows a doping profile of a portion of the wafer of FIG. 19.

FIG. 19 shows the composite body 108 after the annealing of FIG. 18. As described with reference to FIG. 7, the annealing causes the dopant ions 10 of the heavily doped layer 112 to diffuse in the thinned wafer 106, forming a diffused layer, here designated by 126, having the thickness $d_{FS,2}$.

Furthermore, in this embodiment, the dopant ions 118 that form the surface implanted portions 120, such as antimony or arsenic, are such as to undergo, substantially, no diffusion during the annealing.

Consequently, in this embodiment, the dimensions and the doping level of the surface implanted portions 120 remain substantially unvaried during the annealing.

However, in a different embodiment, here not illustrated, for example if the dopant ions 118 are arsenic ions, also the surface implanted portions 120 would diffuse within the heavily doped layer 112. In this case, by regulating the temperature and time of the annealing, it is possible to modify the shape, dimensions and doping concentration of the surface implanted portions after the annealing.

In practice, the surface implanted portions 120 form surface portions of the diffused layer 126.

As described with reference to FIG. 8, the diffused layer 126 has, starting from the back surface 106B, a substantially monotonic profile along the third axis Z. Furthermore, for section lines crossing the surface implanted portions 120, as for example shown in FIG. 20 for the line M-M of FIG. 19, the doping profile of the diffused layer 126 has a heavily doped surface portion, formed by the dopant atoms 118 of the surface implanted portions 120, and a deep portion, formed by the dopant atoms 10.

The surface portion has a mean slope, along the third axis Z, greater than the mean slope of the deep portion.

The composite body 108 is then subjected to further processing steps, for example similarly to what has been discussed with reference to FIGS. 9 and 10.

Figure 21:
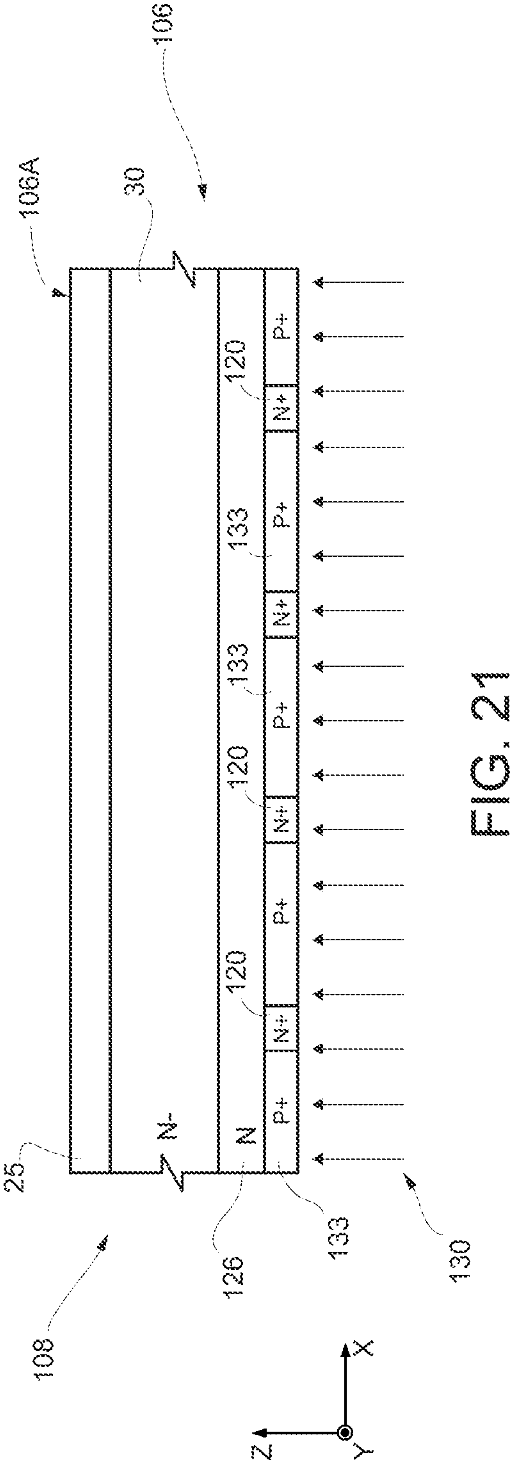
FIG. 21 shows a cross-section of the wafer of FIG. 19, in a subsequent manufacturing step.

In detail, the device functional layer 25 is formed (FIG. 21).

With reference to FIG. 21, dopant ions of a P type, here indicated by arrows 130, are implanted on the back surface 106B of the thinned wafer 106, forming a plurality of back conductive portions 133 in the diffused layer 126.

The dopant ions 130 are implanted with an implantation energy such that the back conductive portions 133 have a thickness, along the third axis Z, smaller than the thickness $d_{FS,2}$ of the diffused layer 126.

In detail, in this embodiment, the back conductive portions 133 have a thickness equal to the thickness $d_{Z1}$ of the surface implanted portions 120.

Furthermore, the dopant ions 130 are implanted with a dose such as not to reverse the conductivity type of the surface implanted portions 120 and to reverse the conductivity type of the diffused layer 126.

The back conductive portions 133 have a doping level comprised, for example, between $1\cdot10^{16}$ atoms/cm$^3$ and $1\cdot10^{19}$ atoms/cm$^3$.

In practice, the back conductive portions 133 each extend, in the diffused layer 126, along the first axis X, between two adjacent surface implanted portions 120.

Figure 22:
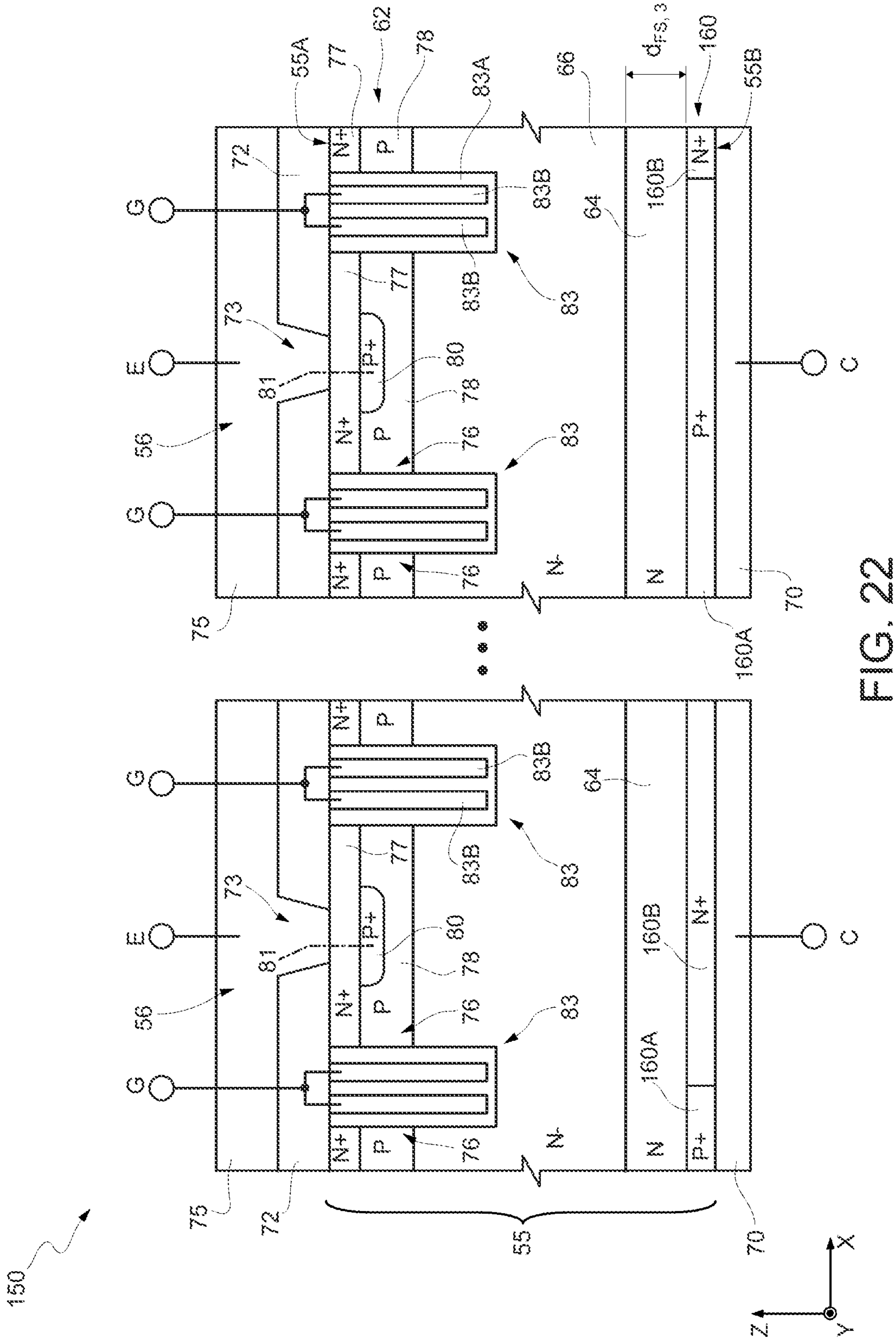
FIG. 22 shows a cross-section of the present vertical-channel semiconductor device, according to a different embodiment.

There then follow the formation of the back metallization layer, for example similarly to what has been described with reference to FIG. 12 and not illustrated here, and known processing steps such as dicing and electrical connection that lead to forming a vertical-channel semiconductor device 150 (FIG. 22).

The advantages discussed with reference to FIGS. 1-12 also apply to the manufacturing process described with reference to FIGS. 14-21. Further, the manufacturing process illustrated in FIGS. 14-21 also allows to obtain, on the back side of the thinned wafer 106, heavily doped surface portions both of a P type and of an N type.

With reference to FIG. 22, the vertical-channel semiconductor device 150, referred to hereinafter as the electronic device 150, has a general structure similar to that of the electronic device 50 of FIG. 13; consequently, elements in common are designated by the same reference numbers and are not described any further herein.

The electronic device 150 comprises a plurality of cells 56, illustrated schematically in FIG. 22, formed in the die 55 and connected together in parallel.

The electronic device 150 is an IGBT transistor, in particular a reverse-conducting IGBT (RC-IGBT) transistor.

In detail, the electronic device 150 comprises, on the front side, the device surface region 62 and, on the back side, the thermally diffused region 64 (corresponding to the diffused layer 126). The drift region 66 extends between the device surface region 62 and the thermally diffused region 64.

In this embodiment, the back conduction region, here designated by 160, comprises portions 160A of a P+ type, corresponding to the back conductive portions 133, and portions 160B of an N+ type, corresponding to the surface implanted portions 120.

The portions 160A, 160B of the back conduction region 160 each have a width, along the first axis X, greater than the distance between two adjacent cells 56. For instance, each portion 160A, 160B may have a width corresponding to around ten adjacent cells 56, or even a few hundreds of adjacent cells 56, according to the specific application.

In this embodiment, the conductive portions 160B comprise dopant atoms, for example arsenic or antimony, different from the dopant atoms, for example phosphorus, of the thermally diffused region 64, in accordance with what has been described with reference to FIG. 16.

As has been described for the electronic device 50, the presence of the conduction region 64, which works as field-stop region, bestows a high robustness and reliability of use on the electronic device 150.

Finally, it is clear that modifications and variations may be made to the present electronic device and to the corresponding manufacturing process described and illustrated herein, without thereby departing from the scope of the present disclosure.

For instance, the conductivity types, P and N, may be reversed with respect to what has been illustrated and described herein.

For instance, the wafer 1 may undergo thinning processes that are different from what has been described with reference to FIG. 3. For example, in addition or as an alternative to what has been described with reference to FIG. 3, the wafer 1 may be thinned using a plasma etch. Plasma etching enables, for example, to modify the planarity of the back surface 1B, according to the specific application.

The body region 78, the source region 77, the gate regions 83 and the body-contact region 80 may extend along the second axis Y according to different shapes and configurations, according to the specific application, in a per se known manner and thus not discussed in detail. For instance, in top plan view (not illustrated herein), the body region 78, the source region 77, the gate regions 83, and the body-contact region 80 may have the shape of strips elongated along the second axis Y, or else may have a circular shape or else any other shape, whether regular or irregular.

For instance, the source region 77, the body-contact region 80, the body region 78, and the gate regions 83 may each form a portion of a respective region having a more complex shape and electrically connected to other portions via dedicated electrical connections.

With reference to the electronic device 150, the portions 160A, 160B of the back conductive region 160 may extend along the second axis Y according to different shapes and configurations, according to the specific application. For instance, in top plan view (not illustrated herein), the portions 160A, 160B may have the shape of strips elongated along the second axis Y, or else may have a circular shape or else any other shape, whether regular or irregular.

Furthermore, the portions 160A, 160B may each form a portion of a respective region having a more complex shape and electrically connected to other portions via purposely provided electrical connections.

The present vertical-channel semiconductor device may be a device of a type different from the IGBT device. For instance, the present semiconductor device may be a vertical-channel MOS transistor; in this case, the back conduction layer 40, described with reference to FIG. 11, is not formed. Consequently, the corresponding semiconductor device does not have the back conduction region 60. In practice, in the MOS transistor, the thermally diffused conduction region 64 forms the back surface 55B of the electronic device.

A manufacturing process of a vertical-channel semiconductor device (50; 150) may starting from a work wafer (1, 6; 106) of semiconductor material having a first side (1A; 106A) and a second side (1B; 106B) opposite to the first side along a direction (Z), the work wafer having a first conductivity type (N) and a first doping level. The manufacturing process may be summarized as including forming, in the work wafer, from the second side of the work wafer, a first doped region (20, 42, 64; 126) having the first conductivity type and a second doping level higher than the first doping level; and forming, in the work wafer, from the first side of the work wafer, a device active region (25, 62) comprising a channel region (76) extending along the direction (Z); the first doped region and the device active region delimiting, in the work wafer, a drift region (30, 66), wherein forming a first doped region is performed before forming a device active region.

Forming a first doped region (20, 42, 64; 126) may include introducing dopant atoms (10) into the work wafer; and annealing the work wafer (6), so as to cause a diffusion of the dopant atoms in the work wafer.

The annealing may be performed at a temperature higher than 400° C.

The annealing may be configured so as that the first doped region has a thickness ($d_{FS,3}$), along the direction (Z), greater than 2 μm.

The first doped region may include dopant atoms chosen in the group including phosphorus, antimony and arsenic.

The manufacturing process may further include thinning the work wafer (1) before forming a first doped region.

The manufacturing process may further include forming, in the work wafer (6; 106), on the second side (1B; 106B) of the work wafer, a second doped region (40, 60; 133, 160A) having a second conductivity type (P) different from the first conductivity type, the second doped region extending in the work wafer from the second side of the work wafer, in contact with the first doped region.

The manufacturing process may further include forming, in the work wafer (106), on the second side of the work wafer, a third doped region (120, 160B) having the first conductivity type (N) and a third doping level higher than the second doping level, the third doped region extending in the work wafer, from the second side of the work wafer, in contact with the first doped region (126, 64).

The first doped region may include first dopant atoms (10), and forming a third doped region (133) may include introducing in the work wafer, from the second side of the work wafer, second dopant atoms (118) different from the first dopant atoms.

The manufacturing process may further include bonding a first temporary support body (5) on the first side (1A) of the work wafer (1), before forming a first doped region; bonding a second temporary support body (15) on the second side (1B) of the work wafer (6), before forming a device active region; and removing the first temporary support body before forming a device active region.

A vertical-channel semiconductor device (50; 150) formed in a body (55) of semiconductor material having a first side (55A) and a second side (55B) opposite to the first side along a direction (Z), may be summarized as including a drift region (66) extending in the body, having a first conductivity type (N) and a first doping level; a first doped region (64) extending in the body, on the second side (55B) of the body, having the first conductivity type and a second doping level higher than the first doping level; and a device active region (62) extending in the body, on the first side (55) of the body, and comprising a channel region (76) extending along the direction, wherein the first doped region is a thermally diffused doped region.

The first doped region may have a thickness ($d_{FS,3}$), along the direction (Z), comprised between 2 μm and 40 μm.

The first doped region (64) may have a doping level having a monotonic profile along the direction (Z).

The body (55) may have a thickness, along the direction (Z), between 40 μm and 200 μm.

The device may further include a second doped region (60; 160A) having a second conductivity type (P) different from the first conductivity type, the second doped region extending in the body (55), starting from the second side (55B) of the body, the first doped region (64) extending between the drift region (66) and the second doped region (60).

The device may further include a third doped region (160B) having the first conductivity type and a third doping level higher than the second doping level, the third doped region extending in the body (55), starting from the second side (55B) of the body, the first doped region (64) extending between the drift region (66) and the third doped region (160B).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing process of a vertical-channel semiconductor device, the manufacturing process comprising:

bonding a first temporary support body to a first side of a work wafer of semiconductor material;

forming, after bonding the first temporary support body and in the work wafer, a first doped, region at a second side of the work wafer, the second side being opposite to the first side along a direction, the work wafer and the first doped region having a first conductivity type, the work wafer having a first doping level, the first doped region having a second doping level higher than the first doping level; and removing the first temporary support body;

bonding a second temporary support body to the first doped region on the second side of the work wafer; and forming, after bonding the second temporary support body, in the work wafer, and at the first side of the work wafer, a device active region including a channel region extending along the direction, the first doped region and the device active region delimiting, in the work wafer, a drift region, forming of the first doped region being performed before forming of the device active region.

2. The manufacturing process according to claim 1, wherein forming of the first doped region includes:

introducing dopant atoms into the work wafer; and annealing the work wafer so as to cause a diffusion of the dopant atoms in the work wafer.

3. The manufacturing process according to claim 2, wherein the annealing is performed at a temperature higher than 400° C.

4. The manufacturing process according to claim 2, wherein the first doped region has a thickness, along the direction, greater than 2 μm.

5. The manufacturing process according to claim 1, wherein the first doped region includes dopant atoms selected from a group including phosphorus, antimony, and arsenic.

6. The manufacturing process according to claim 1, further comprising:

thinning the work wafer before forming the first doped region.

7. The manufacturing process according to claim 1, further comprising:

forming, in the work wafer and at the second side of the work wafer, a second doped region having a second conductivity type different from the first conductivity type, the second doped region extending in the work wafer from the second side of the work wafer and in contact with the first doped region.

8. The manufacturing process according to claim 7, further comprising:

forming a metallization layer on the second doped region.

9. The manufacturing process according to claim 1, further comprising:

forming, in the work wafer and at the second side of the work wafer, a second doped region having the first conductivity type and a third doping level higher than the second doping level, the second doped region extending in the work wafer from the second side of the work wafer and in contact with the first doped region.

10. The manufacturing process according to claim 9, wherein the first doped region includes first dopant atoms, and forming the second doped region includes introducing in the work wafer, from the second side of the work wafer, second dopant atoms different from the first dopant atoms.

11. A method, comprising:

forming a first doped layer on a first side of a wafer, the first doped layer and the wafer having a first conductivity type, the first doped layer having a higher doping level than the wafer;

annealing the first doped layer and the wafer;

bonding a support body to the first doped layer;

forming, subsequent to bonding the support body, a device functional layer on a second side, opposite to the first side, of the wafer;

forming a window in the support body, the window exposing the first doped layer; and forming a second doped layer on the first doped layer by implantation through the window, the second doped layer having a second conductivity type.

12. The method according to claim 11, wherein the annealing is performed at a temperature higher than 400° C.

13. The method according to claim 11, further comprising:

thinning, prior to forming the first doped layer, the wafer.

14. The method according to claim 11, further comprising:

forming a vertical-channel semiconductor device in at least the device functional layer.

15. The method according to claim 11, further comprising:

forming, in the window, a metallization layer on the second doped layer.

16. A method, comprising:

forming, in a first side of a wafer having a first conductivity type, a first doped layer having the first conductivity type, the first doped layer having a higher doping level than the wafer;

bonding a support body to the first doped layer;

forming, in a second side of the wafer, a device functional layer;

forming a window in the support body, the window exposing the first doped layer; and forming, in the window, a second doped layer on the first doped layer, the second doped layer having a second conductivity type.

17. The method of claim 16, further comprising:

forming a diffused layer in the first doped layer; and forming a drift layer in the wafer.

18. The method of claim 17, wherein the device functional layer is formed in the drift layer.

19. The method according to claim 16, further comprising:

forming, in the window, a metallization layer on the second doped layer.

* * * * *